(12) United States Patent
Aoki et al.

(10) Patent No.: US 11,664,263 B2
(45) Date of Patent: May 30, 2023

(54) SUBSTRATE PROCESSING METHOD AND SUBSTRATE PROCESSING APPARATUS

(71) Applicant: Tokyo Electron Limited, Tokyo (JP)

(72) Inventors: Yusuke Aoki, Miyagi (JP); Ryusei Kashimura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 100 days.

(21) Appl. No.: 17/408,658

(22) Filed: Aug. 23, 2021

(65) Prior Publication Data
US 2022/0059385 A1     Feb. 24, 2022

(30) Foreign Application Priority Data

Aug. 24, 2020  (JP) .............................. JP2020-141073

(51) Int. Cl.
| | | |
|---|---|---|
| H01L 21/683 | (2006.01) | |
| H01L 21/687 | (2006.01) | |
| H01J 37/32  | (2006.01) | |

(52) U.S. Cl.
CPC .... H01L 21/6833 (2013.01); H01J 37/32724 (2013.01); H01L 21/68742 (2013.01)

(58) Field of Classification Search
CPC ......... H01L 21/67103; H01L 21/67109; H01L 21/67248; H01L 21/6831; H01L 21/6833; H01L 21/68742; H01J 37/32724
USPC ....................................................... 364/234
See application file for complete search history.

(56) References Cited

U.S. PATENT DOCUMENTS

| | | | | |
|---|---|---|---|---|
| 5,956,837 A | * | 9/1999 | Shiota ................. | H01L 21/6833 29/559 |
| 6,125,025 A | * | 9/2000 | Howald .............. | H01L 21/6833 279/128 |
| 7,014,092 B2 | * | 3/2006 | Narita ............... | H01L 21/67138 228/8 |
| 2009/0088041 A1 | * | 4/2009 | Inoue .................. | H01L 21/6831 445/73 |

(Continued)

FOREIGN PATENT DOCUMENTS

| | | | | |
|---|---|---|---|---|
| JP | 2004172487 A | * | 6/2004 | |
| JP | 2013-161899 | | 8/2013 | |
| JP | 2013161899 A | * | 8/2013 | ............. G01R 19/25 |

OTHER PUBLICATIONS

Machine translation of Torigoe et al. Japanese Patent Document JP 2004-172487 A Jun. 17, 2004 (Year: 2004).*

(Continued)

*Primary Examiner* — Kevin J Comber
(74) *Attorney, Agent, or Firm* — IPUSA, PLLC

(57) ABSTRACT

A substrate processing method is provided. The method includes a) causing a substrate to be attracted to an electrostatic chuck, and b) processing the substrate. The method includes c) determining a charge removal temperature based on information preliminarily stored in a storage, thereby adjusting a surface temperature of the electrostatic chuck to be greater than or equal to the determined charge removal temperature, the information indicating a relationship between a maximum surface temperature of the electrostatic chuck, during substrate processing, and a residual charge amount for the processed substrate. The method includes d) removing a charge from the processed substrate.

12 Claims, 9 Drawing Sheets

(56) References Cited

U.S. PATENT DOCUMENTS

2010/0248490 A1* 9/2010 McMillin .......... H01L 21/68742
                                                        700/282

OTHER PUBLICATIONS

Machine translation of Kawabata Japanese Patent Document JP 2013-161899 A Aug. 19, 2013 (Year: 2013).*

* cited by examiner

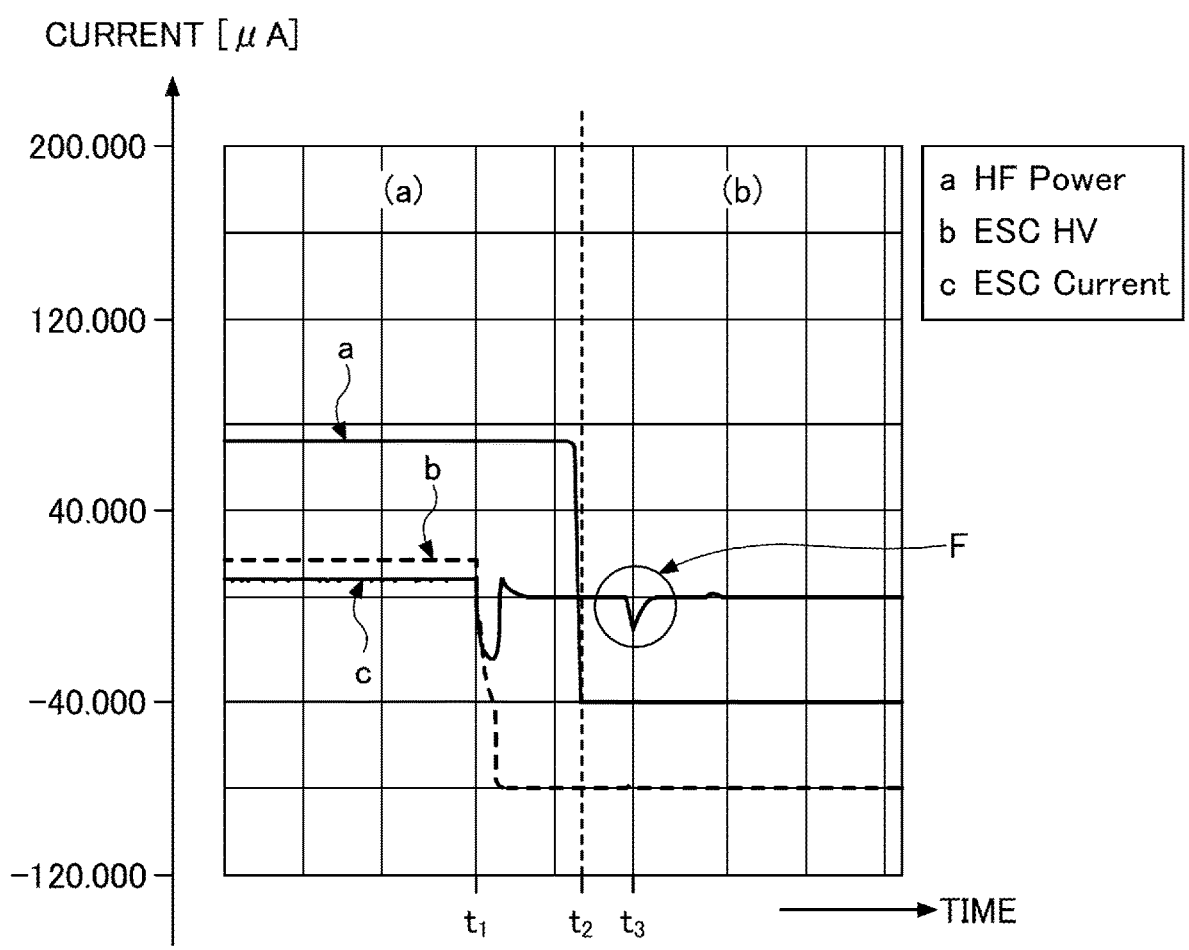

SUBSTRATE PROCESSING METHOD AND SUBSTRATE PROCESSING APPARATUS

CROSS-REFERENCE TO RELATED APPLICATION

This patent application claims priority to Japanese Patent Application No. 2020-141073, filed Aug. 24, 2020, the contents of which are incorporated herein by reference in their entirety.

TECHNICAL FIELD

The present disclosure relates to a substrate processing method and a substrate processing apparatus.

BACKGROUND

Japanese Unexamined Patent Application Publication No. 2013-161899, which is hereinafter referred to as Patent document 1, proposes a method of removing a workpiece from an electrostatic chuck. The method includes acquiring a value by integrating a current flowing from a chuck electrode over time, and the current is based on a measured result of the current that flows from the chuck electrode, during a predetermined time period. In the measured result, after plasma treatment is performed with respect to the workpiece, the current flows in response to interrupting supply of a voltage applied to the chuck electrode. The method also includes determining a difference between an amount of charge on the chuck electrode stored during the plasma treatment and the acquired value of the current that is integrated over time. The method further includes determining a counter voltage corresponding to a residual charge on the electrostatic chuck, based on the determined difference, as well as using a preset relationship between the acquired value of the current that is integrated over time and torque applied to each supporting pin for the workpiece. The method also includes applying the counter voltage to the chuck electrode, while forming a plasma from gas that is introduced into a processing chamber.

CITATION LIST

Patent Document

Patent document 1: Japanese Unexamined Patent Application Publication No. 2013-161899

SUMMARY

According to one aspect of the present disclosure, a substrate processing method is provided. The method includes a) causing a substrate to be attracted to an electrostatic chuck, and b) processing the substrate. The method includes c) determining a charge removal temperature based on information preliminarily stored in a storage, thereby adjusting a surface temperature of the electrostatic chuck to be greater than or equal to the determined charge removal temperature, the information indicating a relationship between a maximum surface temperature of the electrostatic chuck, during substrate processing, and a residual charge amount for the processed substrate. The method includes d) removing a charge from the processed substrate.

BRIEF DESCRIPTION OF THE DRAWINGS

FIG. 3 is a diagram illustrating an example of the magnitude of currents flowing through a chuck electrode of an electrostatic chuck, during and after the charge removal process;

DETAILED DESCRIPTION

One or more embodiments of the present disclosure will be described with reference to the drawings. Note that in each drawing, the same numerals denote the same components, and duplicate description for the components may be omitted.

[Plasma Processing System]

Figure 1:
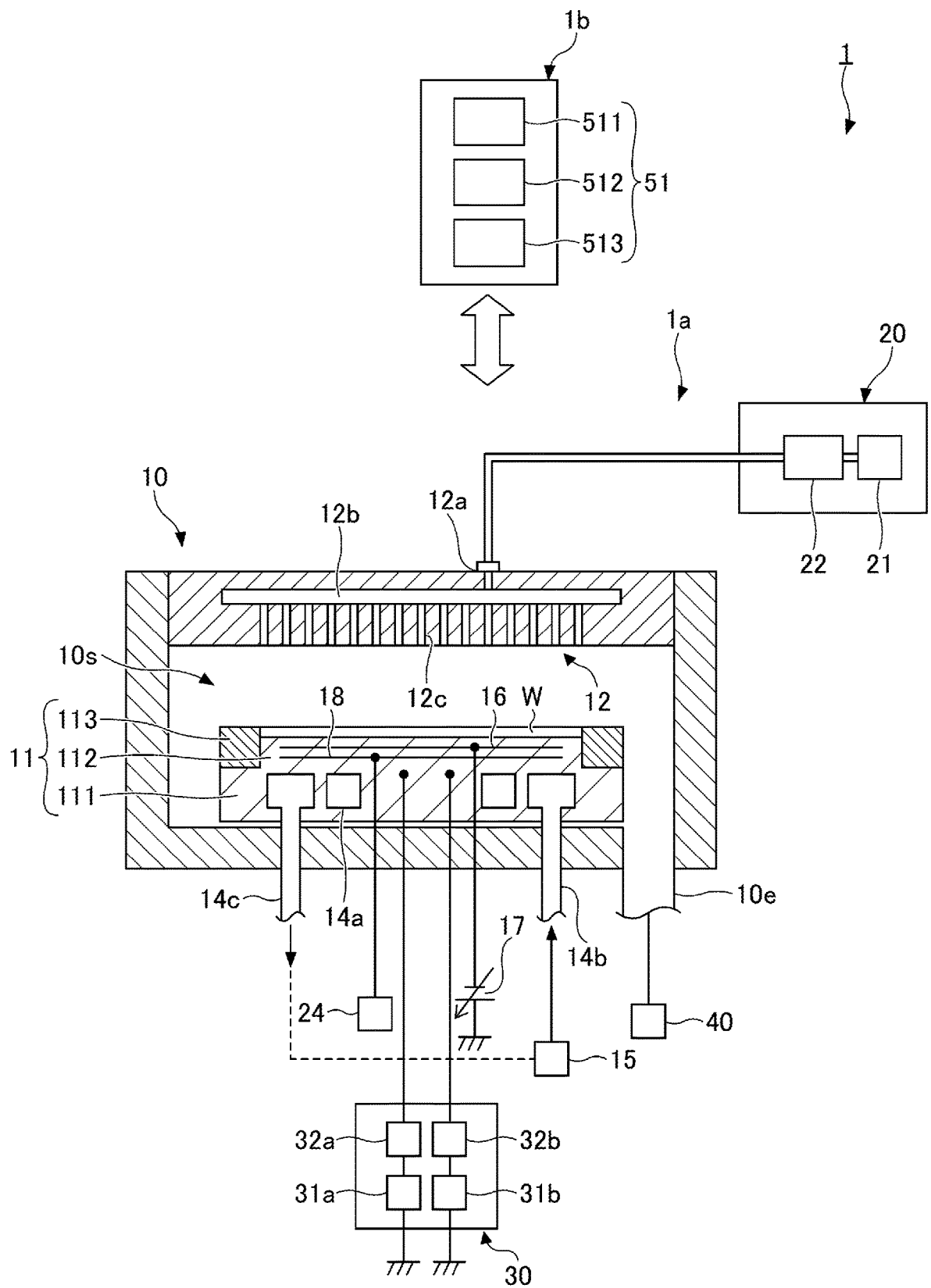
FIG. 1 is a cross-sectional view schematically illustrating an example of a plasma processing system according to one embodiment.

An example of a plasma processing system 1 will be described with reference to FIG. 1. The plasma processing system 1 can be used to perform a substrate processing method, as described in a first embodiment and second embodiment below.

In one embodiment, the plasma processing system 1 includes a substrate processing apparatus 1a and a controller 1b. The substrate processing apparatus 1a includes a chamber 10, a gas supply 20, a radio frequency (RF) power supply 30, and an exhaust system 40. The substrate processing apparatus 1a also includes a stage 11 and a showerhead 12 that serves as a top electrode. The stage 11 is disposed in a lower region of a plasma processing space 10s in the chamber 10. The showerhead 12 is disposed above the stage 11. The top electrode showerhead 12 may serve as part of a ceiling of the chamber 10.

The stage 11 is configured to support a substrate W in the plasma processing space 10s. In one embodiment, the stage 11 includes a bottom electrode 111, an electrostatic chuck 112, and an edge ring 113. The electrostatic chuck 112 is disposed on the bottom electrode 111 and the substrate W is supported on a top of the electrostatic chuck 112. The edge ring 113, which is located above a peripheral portion of the bottom electrode 111, is disposed to encircle the substrate W.

A flow path 14a is formed in an interior of the bottom electrode 111. A temperature-controlled medium is supplied from a chiller unit 15 to a flow path 14a, via an inlet line 14b, and then returns to the chiller unit 15 via an outlet line 14c. The chiller unit 15 is disposed outside the chamber 10. The temperature-controlled medium includes cooling water, heat transfer gas, or the like, and flows through the flow path 14a. In such a manner, a temperature of the stage 11, as well as a temperature of the substrate W mounted on the stage 11, are adjusted.

A heater 18, which is a heating device, is provided above the flow path 14a in the bottom electrode 111. The heater 18 is connected to a heater power source 24. The heater 18 adjusts the temperature of each of the stage 11 and the substrate W mounted on the stage 11, in response to a voltage applied to the heater 18 by the heater power source 24.

The electrostatic chuck 112 is formed of an insulator, and a conductive chuck electrode 16 is provided in an interior of the electrostatic chuck 112. The chuck electrode 16 is connected to a DC power source 17. When the DC power source 17 applies a DC voltage to the chuck electrode 16, the electrostatic chuck 112 attracts and holds the substrate W through an electrostatic attractive force.

In order to supply a heat transfer gas, such as helium (He) gas, from a transfer gas source (not illustrated) to a back of the substrate H, a heat transfer-gas passage (not illustrated) is provided in the stage 11. Such a heat transfer gas causes increased heat transfer between the stage 11 and the substrate W, and thus the temperature of the substrate H, on a mounting surface of the stage 11, attracted by the electrostatic chuck 112 can be adjusted to a predetermined temperature.

The top electrode showerhead 12 is configured to supply one or more process gases from the gas supply 20 to the plasma processing space 10s. In one embodiment, the showerhead 12 includes a gas inlet 12a, a gas diffusion compartment 12b, and gas outlets 12c. The gas inlet 12a is in fluidic communication with the gas supply 20 and the gas diffusion compartment 12b. The gas outlets 12c are in fluidic communication with the gas diffusion compartment 12b and the plasma processing space 10s. In one embodiment, the showerhead 12 is configured to supply one or more process gases from the gas inlet 12a to the plasma processing space 10s, through the gas diffusion compartment 12b and the gas outlets 12c.

The gas supply 20 may include one or more gas sources 21 and one or more flow controllers 22. In one embodiment, the gas supply 20 is configured to supply one or more process gases from the respective gas sources 21 to the gas inlet 12a, via corresponding respective flow controllers 22. Each flow controller 22 may include, for example, a mass flow controller or a flow controller employing a pressure control. Moreover, the gas supply 20 may include one or more flow modulating devices each of which modulates or pulses a flow rate of a given process gas.

The RF power supply 30 is configured to supply RF power to a given electrode that is either the bottom electrode 111 or the showerhead 12. Alternatively, the RF power supply 30 is configured to supply RF power to electrodes that are both the bottom electrode 111 and the showerhead 12. For example, the RF power includes one or more RF signals. Thus, a plasma is formed from one or more process gases that are supplied to the plasma processing space 10s. In such a manner, the RF power supply 30 can constitute part of a plasma generator, which is configured to form a plasma from one or more process gases in the chamber. In one embodiment, the RF power supply 30 includes two RF generators 31a and 31b and two matching circuits 32a and 32b. The RF power supply 30 includes a first RF generator 31a and a first matching circuit 32a. In one embodiment, a first RF signal is supplied from the first RF generator 31a to the bottom electrode 111, via the first matching circuit 32a. For example, the first RF signal may be set at frequencies in the range of 60 MHz to 300 MHz.

The RF power supply 30 includes a second RF generator 31b and a second matching circuit 32b. In one embodiment, a second RF signal is supplied from the second RF generator 31b to the bottom electrode 111, via the second matching circuit 32b. For example, the second RF signal may be set at frequencies in the range of 400 kHz to 13.56 MHz. Alternatively, instead of the second RF generator 31b, a direct current (DC) pulse generator may be used.

Although not illustrated, other embodiments of the present disclosure may be applied. For example, in an alternative embodiment, the RF power supply 30 supplies the first RF signal from a given. RF generator to the showerhead 12, the second RF signal is supplied from another RF generator to the bottom electrode 111, and a third RF signal may be supplied from still another RF generator to the bottom electrode 111. Further, in the alternative embodiment, a DC voltage may be applied to the showerhead 12.

Moreover, in various embodiments, an amplitude of each of one or more RF signals (e.g., a first RF signal, a second RF signal, and the like) may be pulsed or modulated. By amplitude modulation, amplitudes of an RF signal may be varied in both an on-state and an off-state. Alternatively, amplitudes of the RF signal at two or more different on-state levels may be varied.

For example, the exhaust system 40 may be connected to an exhaust port 10e provided at the bottom of the chamber 10. The exhaust system 40 may include a pressure valve and a vacuum pump. The vacuum pump may include a turbomolecular pump, a roughing pump, or a combination thereof.

In one embodiment, the controller 1b executes a computer-executable instruction that causes the substrate processing apparatus 1a to perform various steps as described in the present disclosure. The controller 1b may be configured to control each component of the substrate processing apparatus 1a to perform the various steps described herein. In one embodiment, the controller 1b may be partially or entirely included in the substrate processing apparatus 1a.

For example, the controller 1b may be implemented by a computer 51. For example, the computer 51 may include a central processing unit (CPU) 511, a storage 512, and a communication interface 513. The CPU 511 performs various control operations using a recipe and program stored in the storage 512. The storage 512 may include a random access memory (RAM), a read only memory (ROM), a hard disk drive (HDD), a solid state drive (SSD), or any combination thereof. The communication interface 513 may communicate with the substrate processing apparatus 1a via a communication line such as a local area network (LAN).

When the substrate W is processed, the substrate W is transferred to the plasma processing space 10s in the chamber 10. The substrate N is held by supporting pins each of which protrudes from the electrostatic chuck 112. The substrate N is mounted on the electrostatic chuck 112 by lowering the supporting pins. A DC voltage from the DC power source 17 is applied to the chuck electrode 16 and thus the electrostatic chuck 112 attracts the substrate W through an electrostatic attractive force.

In such a manner, an appropriate process such as etching is performed with respect to the substrate W. After the substrate is processed, a charge removal process is performed so that a residual charge is removed from the substrate W. subsequently, by raising the supporting pins, the substrate W is removed from the electrostatic chuck 112. The removed substrate W is transferred from the chamber 10. In the present embodiment, in order to efficiently remove the charge from the substrate, after the charge removal process, when the supporting pins are raised, and thus the substrate is removed from the electrostatic chuck (hereafter also referred to as raising of the supporting pins), the magnitude of the current flowing through the chuck electrode 16 is measured, and an anticipated residual charge amount (i.e., an anticipated value indicating a given residual charge on the substrate) is determined based on the measured current magnitude. During the charge removal process, the temperature of the electrostatic chuck 112 is adjusted to an optimal value, based on the relationship between the anticipated residual charge amount and a given surface temperature of the electrostatic chuck 112.

[Calculation of Anticipated Residual Charge Amount]

Figure 2A:
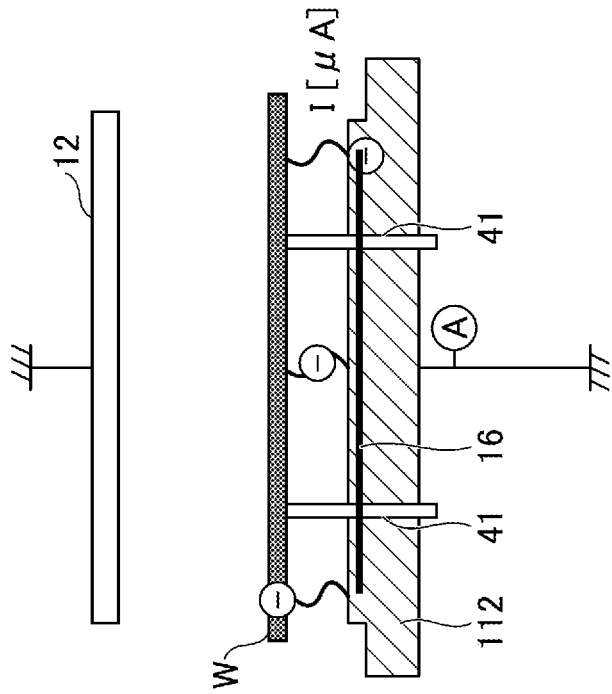
FIGS. 2A and 2B are diagrams illustrating an example of a charge removal process according to one embodiment.
Figure 2B:
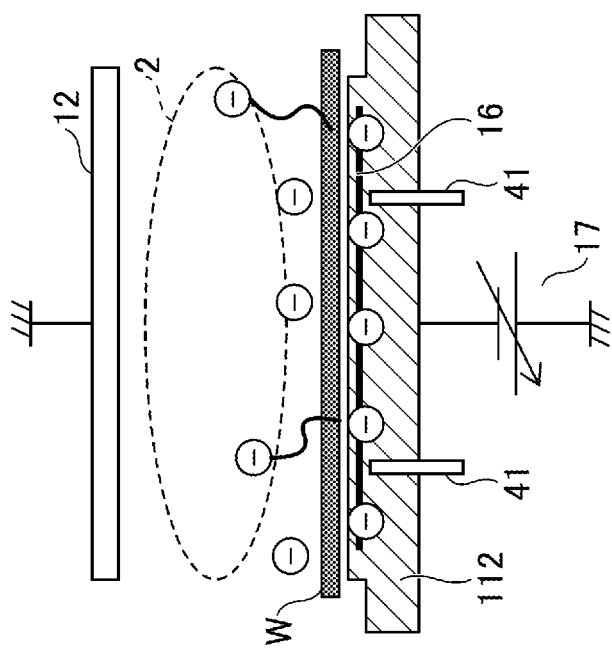

A method for calculating an anticipated residual charge amount Q will be described with reference to FIG. 2A to FIG. 3. FIGS. 2A and 2B are diagrams illustrating an example of the charge removal process. FIG. 3 is a graph illustrating an example of the magnitude of currents flowing through the chuck electrode 16 of the electrostatic chuck 112 (ESC), during and after the charge removal process.

A condition under which the charge removal process in FIG. 2A is performed will be described. In the charge removal process, after a plasma is formed in the chamber 10, a negative DC voltage is applied to the chuck electrode 16 (charge removal using a plasma). In this case, the temperature of the electrostatic chuck 112 influences the mobility of a given residual charge. In light of the situation described above, an example of a charge removal condition (a plasma condition and a temperature of the electrostatic chuck) can be set below as a first charge removal condition.

First Charge Removal Condition

Pressure of chamber: 100 mT (13.3 Pa)
First RF signal/second RF signal: 200 W/0 W
Gas type: $O_2$ gas
Surface temperature of electrostatic chuck: 65° C.

As illustrated in FIG. 2A, when the charge removal process is performed, a negative charge accumulated on the top of the substrate W discharges through a plasma, and the negative charge is thereby removed from the substrate W. After the charge is removed from the substrate, supply of the first RF signal to the bottom electrode 111 is interrupted and thus the plasma is extinguished.

Subsequently, as illustrated in FIG. 2B, by raising the supporting pins 41, the substrate W is removed from the electrostatic chuck 112, and then the substrate W is transferred from the chamber 10. While the supporting pins 41 are raised, if a positive charge remains on the bottom of the substrate W, the positive charge flows into a feeder connected to a ground, via the chuck electrode 16. The resulting current is measured using an ammeter A attached to the feeder. A measured current magnitude indicates that a given charge (residual charge) remaining on the substrate W is moved.

In FIG. 3, the signal "a" expresses a given first RF signal (HE power), as adjusted in FIGS. 2A and 2B, the voltage "b" expresses a given DC voltage (HV) supplied to the electrostatic chuck 112 (ESC), and the current magnitude "c" expresses the magnitude of a given current (ESC current) flowing through the chuck electrode 16.

In FIG. 3, the horizontal axis represents the time, and the vertical axis represents the current. As shown in the figure to the left relative to a vertical line (dashed line), FIG. 3(a) relates to parameters measured during the charge removal process in FIG. 2A. FIG. 3(b), as shown in the figure to the right, relates to parameters measured after the charge removal process in FIG. 2B. In FIGS. 3(a) and (b), the parameters are the first RF signal a, the DC voltage b applied to the chuck electrode 16, and the magnitude c of the current flowing into the chuck electrode 16. The first RF signal a is radio frequency power, as expressed as HF power. As illustrated with respect to the vertical axis in FIG. 3, the radio frequency power changes from high level to low level. Also, the DC voltage applied to the chuck electrode 16 changes from positive to negative. For example, during the charge removal process in FIG. 3(a), the first RF signal a, indicating the radio frequency power, is maintained at high power level, and then changes to low power level at the time point Subsequently, after the charge removal process, the radio frequency signal a is maintained at low power level, as illustrated in FIG. 3(b).

In the substrate processing method according to the present embodiment, in response to applying a negative DC voltage to the chuck electrode 16 at a time point t1 at which the charge removal process is being performed, a given DC voltage b to be supplied to the chuck electrode 16 is adjusted from positive to negative. Subsequently, supply of the first RF signal a is interrupted at a time point t2 after a predetermined time elapses from the time point t1, and a plasma is thereby extinguished. The charge removal process is then terminated. Next, when the supporting pins 41 are raised, and thus the substrate W is raised at a time point $t_3$, the magnitude of a negative current is measured using the ammeter A, as marked with a circle F illustrated in FIG. 3(b).

When an amount of charge accumulated on the electrostatic chuck 112 during raising of the supporting pins 41 is expressed as a residual charge amount Q, the CPU 511 of the controller 1b calculates the residual charge amount Q, based on the relation of I=Q/t. Specifically, the CPU 511 calculates, as the residual charge amount Q, a value obtained by integrating, over time, the current magnitude c measured during raising of the supporting pins 41.

In the measurement, because a time period, as expressed by "F" in FIG. 3(b), during which the current flows, is extremely short, time resolution (log rotation) is preferably 5 ms or less. A method of measuring the residual charge amount Q for the substrate W is not limited to the manner described above. As described in Japanese Unexamined Patent Application Publication No. 2018-107265, before a given substrate is removed from the electrostatic chuck, a given residual charge amount Q for the given substrate may be measured while one or more supporting pins vibrate. In such a method of measuring the residual charge amount, after a given substrate N is processed, the given substrate w vibrates in accordance with the supporting pins that move upward and downward, and then a given residual charge amount for the given substrate W is calculated based on an induced current that flows through the chuck electrode when the given substrate w vibrates. Note, however, that any known method may be applied to the method of measuring the residual charge amount.

Figure 4:
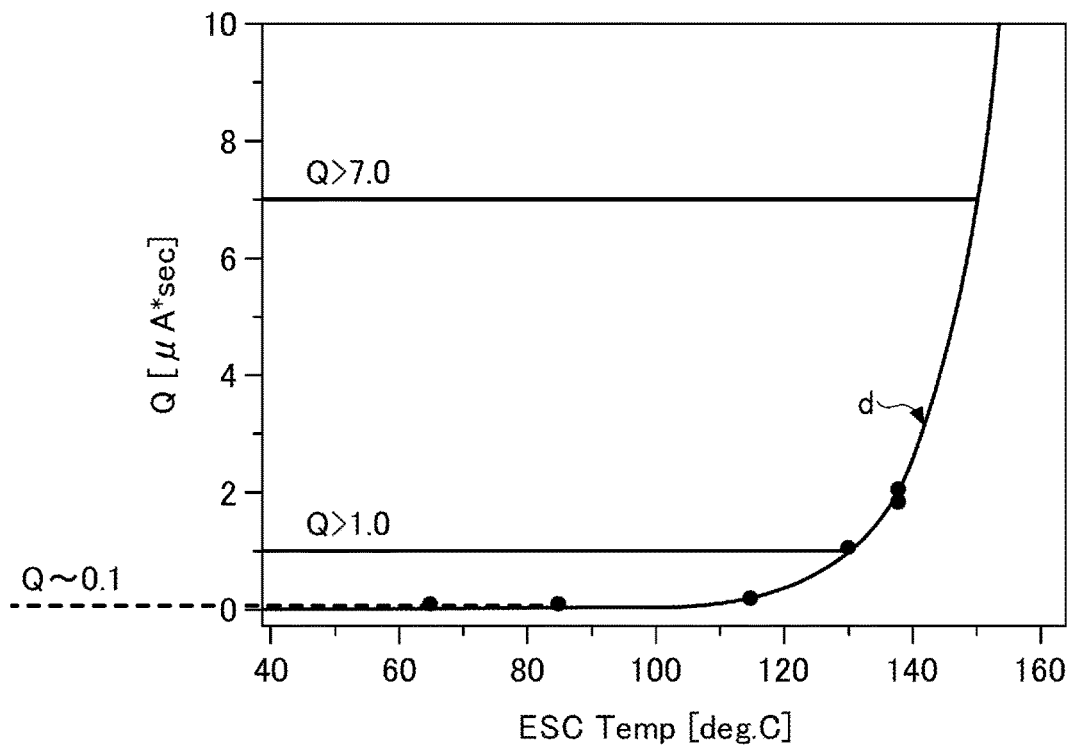
FIG. 4 is a graph illustrating an example of an approximate curve showing the relationship between a residual charge amount and a maximum surface temperature of the electrostatic chuck set during raising of supporting pins according to one embodiment.

FIG. 4 is a graph illustrating an example of the relationship between the residual charge amount Q and a maximum value (maximum surface temperature) of a surface temperature of the electrostatic chuck 112 measured during substrate processing according to one embodiment. In FIG. 4, the horizontal axis represents the maximum surface temperature of the electrostatic chuck 112 measured during substrate processing. Also, the vertical axis represents the residual charge amount Q measured by the above-mentioned method of measuring the residual charge amount, for example. The residual charge amount Q corresponds to an amount of charge transferred from the chuck electrode 16.

As illustrated in FIG. 4, an approximate curve d shows the relationship between the residual charge amount Q for the substrate W and the maximum surface temperature of the electrostatic chuck 112 measured during substrate processing. For example, if an amount (residual charge amount Q) of charge remaining on the substrate W is large, the charge is easily transferred from the electrostatic chuck 112. In other words, it is easy to remove the charge. The charge is more likely to move as the surface temperature of the electrostatic chuck 112 increases. In other words, it can be seen that the residual charge accumulated on the substrate W is more likely to move as the surface temperature of the electrostatic chuck 112 increases, thereby allowing increased efficiency in removing the charge. Accordingly, during the charge removal process, by adjusting the surface temperature of the electrostatic chuck 112, increased efficiency in removing the charge can be obtained.

Figure 5:
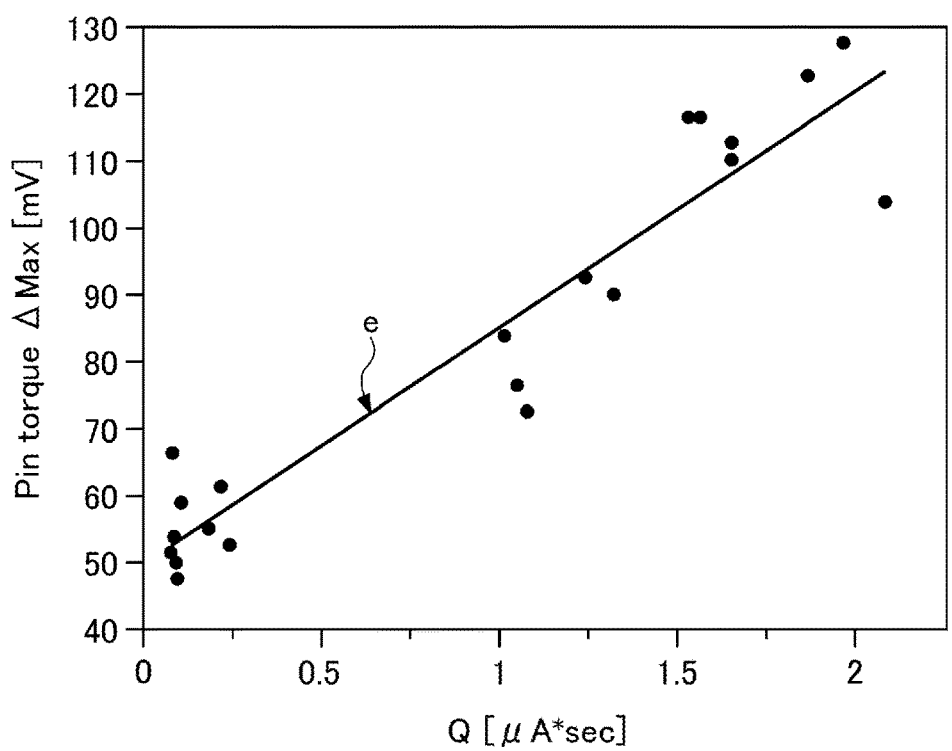
FIG. 5 is a graph illustrating an example of the relationship between the residual charge amount and torque applied to the supporting pins during raising of the supporting pins according to one embodiment.

FIG. 5 is a graph illustrating an example of the relationship between the residual charge amount Q and pin torque applied to each supporting pin 41 during raising of the supporting pins 41 according to one embodiment. The pin torque is torque applied to each supporting pin 41, while the supporting pins 41 are raised to thereby remove the substrate W from the electrostatic chuck 112. In FIG. 5, the horizontal axis represents the residual charge amount Q measured by the above-mentioned method of measuring the residual charge amount. Also, the vertical axis represents a maximum value of the pin torque measured while the supporting pins 41 are raised. As represented as a straight line e in FIG. 5, the relationship between the residual charge amount Q and the pin torque is a positive linear relationship. As the residual charge amount Q is larger, the maximum value of the pin torque increases.

Figure 6:
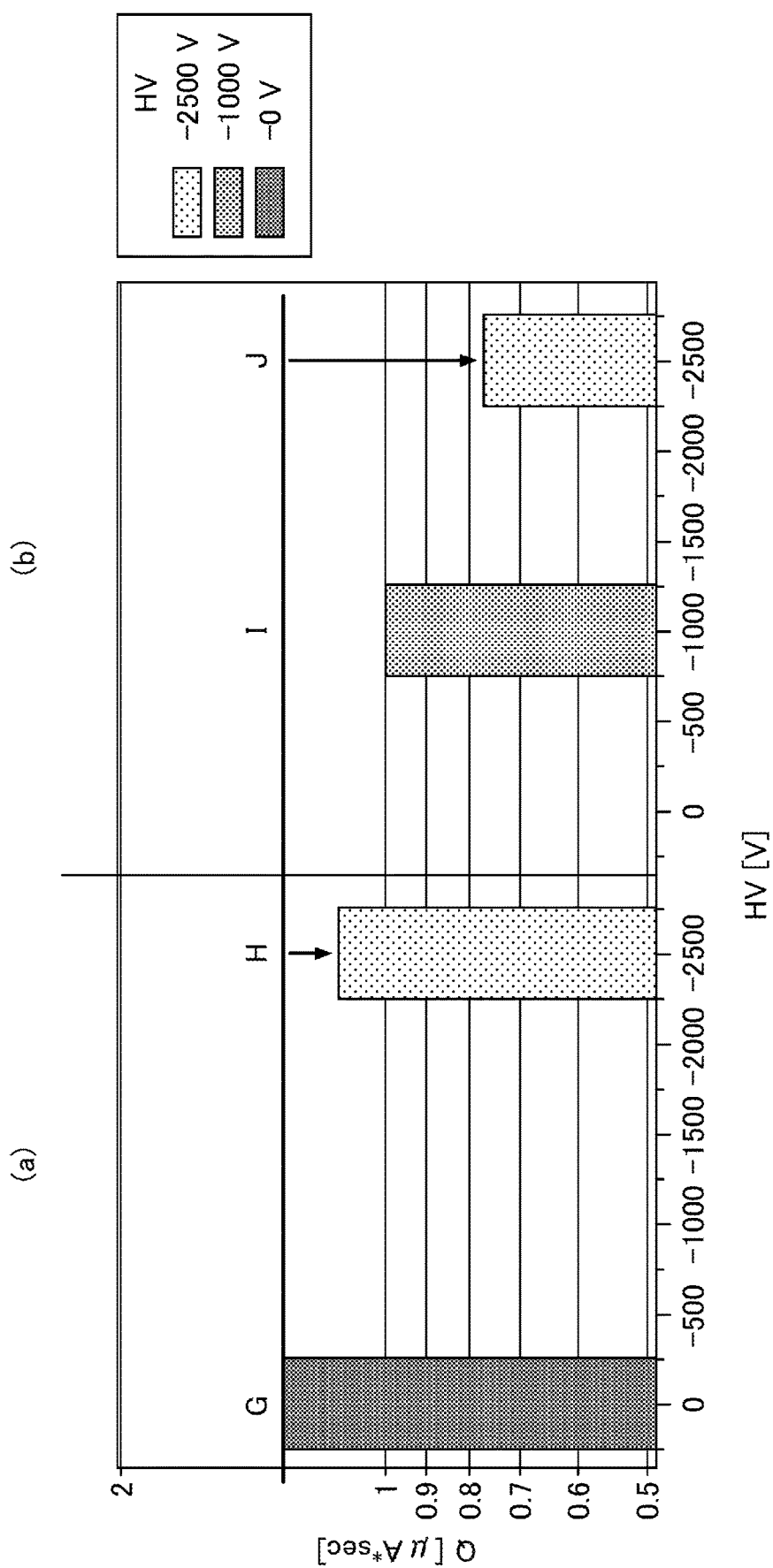
FIG. 6 is a graph illustrating an example of the relationship between a DC voltage and the residual charge amount, with respect to each of charge removal temperatures, according to one embodiment.

In one embodiment, FIG. 6 is a graph illustrating an example of the relationship between the DC voltage and the residual charge amount, with respect to each charge removal temperature. The charge removal temperature indicates a given surface temperature of the electrostatic chuck 112 in the charge removal process. In FIG. 6(a), the charge removal temperature was adjusted to 65° C. In FIG. 6(b), the charge removal temperature was adjusted to 130° C. In FIGS. 6(a) and (b), the horizontal axis represents the DC voltage (HV) applied to the chuck electrode 16, and the vertical axis represents the residual charge amount Q.

In FIG. 6(a) in which the charge removal temperature was adjusted to 65° C., the residual charge amount Q was about 0.1, as illustrated in FIG. 4. In this case, the residual charge amount Q measured in a case where, as expressed by "H" in FIG. 6(a), charge was removed using a plasma, while applying the DC voltage of −2500 V to the chuck electrode 16, was not greatly reduced in comparison to the residual charge amount Q measured in a case where, as expressed by "G" in FIG. 6(a), the charge was removed using a plasma, without applying the DC voltage to the chuck electrode 16.

In contrast, in FIG. 6(b) in which the charge removal temperature was adjusted to 130° C., the residual charge amount Q (>1.0) is greater than or equal to 10 times the residual charge amount Q measured when the charge removal temperature was adjusted to 65° C., as illustrated in FIG. 4. In this case, the residual charge amount Q measured in a case where, as expressed by "I" in FIG. 6(b), the charge was removed using a plasma, while applying the DC voltage of −1000 V to the chuck electrode 16, was reduced in comparison to the residual charge amount Q measured in a case where, as expressed by "H" in FIG. 6(a), the charge was removed using a plasma, while applying the DC voltage of −2500 V to the chuck electrode 16. Also, as expressed by "J" in FIG. 6(b), when the charge was removed using a plasma, while applying the DC voltage of −2500 V to the chuck electrode 16, a smaller residual charge amount Q was measured.

In such a manner, in FIG. 4, there is a range in which the residual charge amount Q is about 0.1, which is also referred to as a range of low temperatures (range in which a residual charge is negligible). Also, a surface temperature of the electrostatic chuck 112 at which a given residual charge amount Q is five times the residual charge amount Q in the range of low temperatures described above is referred to as an inflection point of the residual charge amount Q. When the surface temperature of the electrostatic chuck 112 is adjusted to be higher than the inflection point, the residual charge amount Q greatly increases. In this example, the charge removal temperature is set to a temperature (at which Q≥0.5 is satisfied) at which a given residual charge amount Q is greater than or equal to 5 times the residual charge amount Q in the range of low temperatures. Therefore, the given residual charge amount Q that can be transferred during a charge removal process is increased, thereby resulting in efficient transfer of the amount of charge remaining on the substrate W. Accordingly, efficiency in removing the charge can be improved.

Preferably, the charge removal temperature is set to a temperature (at which Q≥1.0 is satisfied) at which a given residual charge amount Q is greater than or equal to 10 times the residual charge amount Q in the range of low temperatures. Thus, the amount of charge remaining on the substrate W can further be transferred efficiently during a charge removal process. Accordingly, efficiency in removing the charge can be further improved.

In contrast, when the charge removal temperature is set to a temperature higher than a temperature (at which Q>7.0 is satisfied) at which a given residual charge amount Q is greater than or equal to 70 times the residual charge amount Q in the range of low temperatures, the set temperature is close to a temperature (200° C.) at which an attraction mode of the electrostatic chuck 112 changes, and consequently an attraction function of the electrostatic chuck 112 might deteriorate. In light of the point described above, the charge removal temperature is set to a temperature (at which Q≤7.0 is satisfied) at which a given residual charge amount Q is less than or equal to 70 times the residual charge amount Q in the range of low temperatures. Accordingly, efficiency in removing the charge can be improved without decreasing the attraction function of the electrostatic chuck 112.

More preferably, the charge removal temperature is set to a temperature (at which Q≤1.5 is satisfied) at which a given residual charge amount Q is less than or equal to 15 times the residual charge amount Q in the range of low temperatures. During the charge removal process, by setting the charge removal temperature of the electrostatic chuck 112 to about 130° C., which is lower than 200° C., efficiency in removing the charge can be improved while attraction characteristics of the electrostatic chuck 112 (ESC) are stably provided.

Information indicating the relationship between the maximum surface temperature of the electrostatic chuck 112 during substrate processing and the residual charge amount Q for the substrate, as illustrated in FIG. 4, is obtained by preliminarily measuring one or more maximum surface temperatures of the electrostatic chuck 112 during substrate processing, as well as one or more residual charge amounts Q for a given substrate. Such information is stored in the storage 512 of the controller 1b.

As an example of the measurement described above, during substrate processing, a maximum surface temperature of the electrostatic chuck 112 is measured immediately before the supporting pins 41 are raised, as described above, and subsequently, in a charge removal process, a value (see FIG. 3) is obtained, as a given residual charge amount Q, by integrating, over time, the current of the magnitude c measured during raising of the supporting pins 41. The resulting relationship between the maximum surface temperature and the residual charge amount Q is set. In such a manner, a given approximate curve showing the relationship between the maximum surface temperature of the electrostatic chuck 112 set during substrate processing and the residual charge amount Q for a given substrate is acquired. The acquired approximate curve is stored in the storage 512 of the controller 1b.

[Substrate Processing Method in Reference Example]

Figure 7:
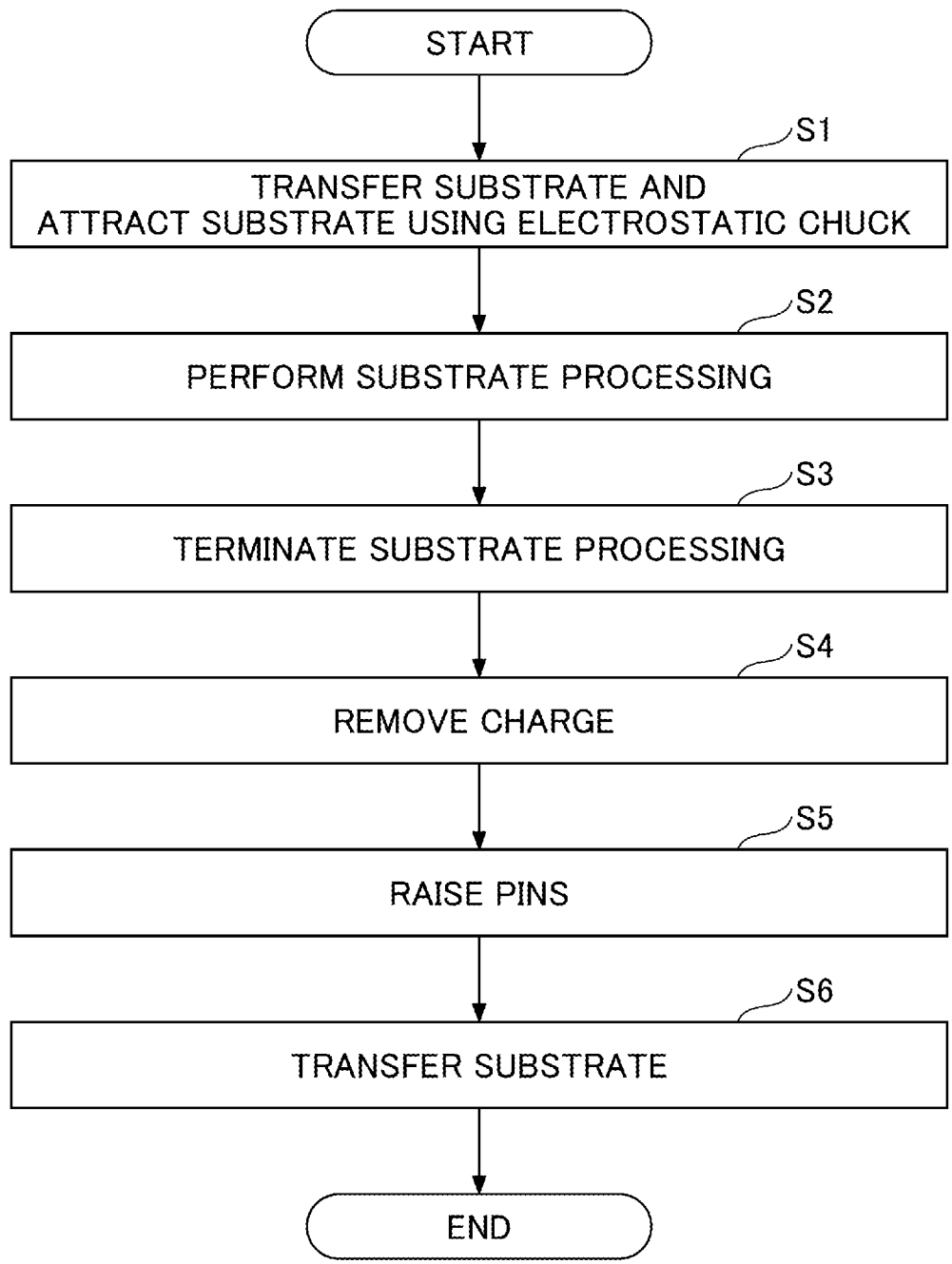
FIG. 7 is a flowchart illustrating an example of a substrate processing method in a reference example.

Prior to describing a substrate processing method according to the present embodiment, a substrate processing method in a reference example will be described below with reference to FIG. 7. FIG. 7 is a flowchart illustrating an example of the substrate processing method in the reference example. For example, the substrate processing method in the reference example includes a method of removing the charge from a given substrate W, and is performed using the substrate processing apparatus 1a, under the control of the controller 1b.

When the substrate processing method in the reference example is performed, the controller 1b causes the given substrate W to be transferred to the chamber 10 to thereby mount the transferred substrate W on the electrostatic chuck 112. Subsequently, the controller 1b causes an appropriate DC voltage from the DC power source 17 to be applied to the chuck electrode 16, so that the substrate W is attracted to the electrostatic chuck 112 (step S1).

Then, the controller 1b causes process gas to be introduced into the chamber 10, and causes a first RF signal to be applied to the bottom electrode 111. The controller 1b also causes a plasma to be formed from the process gas, so that the substrate W is processed as suitably (step S2).

Subsequently, the controller 1b causes substrate processing to be performed based on a recipe. The substrate processing is then terminated (step S3). In this example, the maximum surface temperature of the electrostatic chuck 112 is 65° C. during the substrate processing.

Then, in the reference example, the charge removal process is performed (step S4). In this case, regardless of the surface temperature of the electrostatic chuck 112 set during the substrate processing, a predetermined DC voltage is applied to the chuck electrode 16 to thereby form a plasma, and then a residual charge is discharged to the plasma. Subsequently, the controller 1b causes the supporting pins 41 to be raised to thereby cause the substrate W to be removed from the electrostatic chuck 112 (step S5). Next, the controller 1b causes the substrate N to be transferred from the chamber 10 (step S6). Then, the process is terminated.

A given residual charge amount Q that is transferred from the substrate varies depending on the surface temperature of the electrostatic chuck 112 set during substrate processing. For this reason, when the supporting pins 41 are raised in step S5, a larger residual charge amount Q for the substrate is accumulated in accordance with the surface temperature of the electrostatic chuck 112, which might result in a jump motion of the substrate or cracks in the substrate. For example, in the example of FIG. 5, when the residual charge amount Q is equal to or exceeds 1 [μA·sec], pin torque of greater than about 90 [mV] is required. However, when the pin torque is equal to or exceeds a predetermined threshold at which the operation of the supporting pins 41 stops, the supporting pins 41 might stop lifting the substrate W. In such a case, transfer of the substrate W from the chamber 10 is interrupted and consequently throughput might be decreased. Therefore, by removing the charge efficiently, while the supporting pins 41 are raised, it is desirable to decrease the residual charge amount Q for the substrate to a value that does not cause a lump motion of the substrate or cracks in the substrate. Accordingly, in the substrate processing method according to the first embodiment and second embodiment described below, a given surface temperature of the electrostatic chuck 112 set during a charge removal process is adjusted to remove the charge efficiently.

First Embodiment

Figure 8:
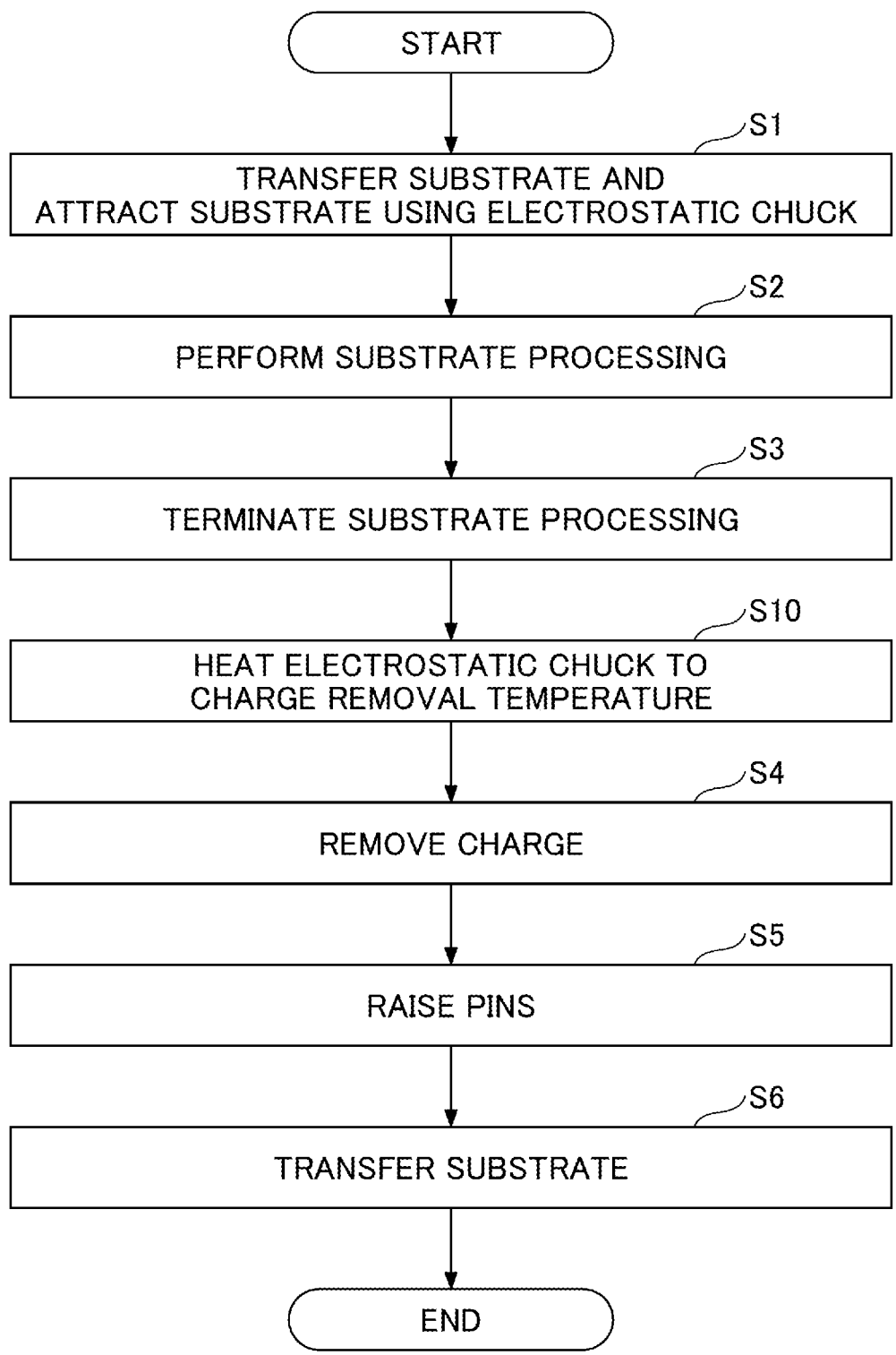
FIG. 8 is a flowchart illustrating an example of a substrate processing method according to a first embodiment.

Hereafter, the substrate processing method according to the first embodiment will be described with reference to FIG. 8. FIG. 8 is a flowchart illustrating an an example of the substrate processing method according to the first embodiment. Note that the same step numbers are used to denote the same steps as those described in the substrate processing method in the reference example.

When the substrate processing method according to the present embodiment is performed, the CPU 511 causes a given substrate W to be transferred to the chamber 10 to thereby mount the transferred substrate W on the electrostatic chuck 112. Subsequently, the CPU 511 causes an appropriate DC voltage from the DC power source 17 to be applied to the chuck electrode 16, so that the substrate W is attracted to the electrostatic chuck 112 (step S1).

Then, the CPU 511 causes process gas to be introduced into the chamber 10, and causes a first RF signal to be applied to the bottom electrode 111. The CPU 511 also causes a plasma to be formed from the process gas, so that the substrate W is processed as suitably (step S2). Subsequently, the CPU 511 causes substrate processing to be performed based on a recipe. The substrate processing is then terminated (step S3).

Then, according to the present embodiment, the substrate W is heated to be greater than or equal to a charge removal temperature (step S10). The charge removal temperature is determined by referring to the storage 512 that preliminarily stores a given approximate curve showing the relationship between the maximum surface temperature of the electrostatic chuck set during substrate processing and the residual charge amount for a given substrate.

Then, the charge removal process is performed (step S4). In this case, a predetermined DC voltage is applied to the chuck electrode 16 to thereby form a plasma. Thus, a residual charge is discharged to the plasma. Subsequently, the controller 1b causes the supporting pins 41 to be raised to thereby cause the substrate W to be removed from the electrostatic chuck 112 (step S5). Next, the controller 1b causes the substrate W to be transferred from the chamber 10 (step S6). Then, the process is terminated.

As described above, in the substrate processing method according to the present embodiment, the following steps (a) to (d) are performed to thereby remove the charge from the substrate W efficiently. In the step (a), the substrate W is attracted to the electrostatic chuck 112. In the step (b), a process such as etching is performed with respect to the substrate W. In the step (c), a charge removal temperature is determined by referring to the storage 512 that preliminarily stores information indicating a given relationship between the maximum surface temperature of the electrostatic chuck 112 set during substrate processing and the residual charge amount Q for the substrate W. Subsequently, the surface temperature of the electrostatic chuck 112 is adjusted to be equal to or exceeds the determined charge removal temperature.

In such a manner, in the step (c), a given residual charge amount Q for the substrate W is measured, and a DC voltage to be applied to the chuck electrode 16 of the electrostatic chuck 112 is determined based on the residual charge amount Q and the determined charge removal temperature. For example, with respect to each of the charge removal temperatures in FIGS. 6(a) and (b), a given relationship between the DC voltage (HV) to be applied to the chuck electrode 16 and a decreased residual charge amount is acquired in advance, and a given DC voltage to be applied to the chuck electrode 16 in a charge removal process is determined based on the acquired relationship and the given residual charge amount Q measured before the supporting pins 41 are raised.

In the step (d), a given charge is removed from the substrate W. In this case, in the step (d), after the electrostatic chuck 112 is heated to a temperature (which is equal to or exceeds the charge removal temperature) at which the residual charge amount Q is easily removed from the substrate W, a charge removal step is performed. Thus, the charge can be efficiently removed from the substrate W.

Note that the step (d) may be performed after the step (c). In other words, after the electrostatic chuck 112 is heated to a given charge removal temperature, the charge removal step is performed. However, the step (c) and step (d) may be performed simultaneously. In other words, the charge removal step may be performed simultaneously with the step in which the electrostatic chuck 112 is heated to the given charge removal temperature.

(Method of Determining Charge Removal Temperature)

As an example of a method of determining the charge removal temperature, the following steps (e) to (h) may be performed. In the step (e), as information indicating a given relationship between the maximum surface temperature of the electrostatic chuck set during substrate processing and the residual charge amount for a given substrate, an approximate curve showing the given relationship between the residual charge amount and the maximum surface temperature of the electrostatic chuck is preliminarily created and stored in the storage 512. Note that an example of the approximate curve is as illustrated in FIG. 4.

In the step (f), a residual charge amount is determined such that a slope of the approximate curve is minimized. In the step (g), the maximum surface temperature of the electrostatic chuck is determined such that a given residual charge amount Q for the substrate is 5 to 70 times the residual charge amount determined in the step (f). The reason why the maximum surface temperature of the electrostatic chuck 112 is a temperature at which the given residual charge amount Q for the substrate is greater than or equal to 5 times the residual charge amount Q determined in the step (f) is because the electrostatic chuck 112 is heated to a temperature at which the given residual charge amount Q is easily removed from the substrate W. If the maximum surface temperature of the electrostatic chuck is a temperature at which the given residual charge amount Q for the substrate is less than 5 times the residual charge amount determined in the step (f), the given residual charge amount Q could not be removed sufficiently from the substrate. Also, the reason why the maximum surface temperature of the electrostatic chuck is a temperature at which the given residual charge amount Q for the substrate is less than or equal to 70 times the residual charge amount determined in the step (f) is as follows. If the electrostatic chuck 112 is heated to a temperature at which the given residual charge amount Q for the substrate is greater than 70 times the residual charge amount determined in the step (f), the heated temperature is close to a given temperature (200° C.) at which an attraction mode of the electrostatic chuck 112 changes and consequently attraction characteristics of the electrostatic chuck 112 might be decreased.

Note, however, that in order to heat the electrostatic chuck 112 to a temperature that makes it easier to remove the given residual charge amount from the substrate W, more preferably, the maximum surface temperature of the electrostatic chuck 112 is a temperature at which the given residual charge amount. Q for the substrate is greater than or equal to 10 times the residual charge amount determined in the step (f). Moreover, more preferably, the maximum surface temperature of the electrostatic chuck 112 is a temperature at which the given residual charge amount Q for the substrate is less than or equal to 15 times the residual charge amount determined in the step (f). This is because if the given residual charge amount Q is greater than 15 times the residual charge amount determined in the step (f), a time might be required to increase the temperature of the electrostatic chuck 112, thereby resulting in decreased throughput.

In particular, when the electrostatic chuck 112 is formed of a ceramic such as alumina ($Al_2O_3$), the charge removal temperature is preferably set to a temperature at which the given residual charge amount Q is less than or equal to 15 times (Q≤1.5) the residual charge amount in the range of low temperatures described above.

For example, in the step (e), as illustrated in the example in FIG. 4, the approximate curve d of the residual charge amount Q in accordance with the maximum surface temperature of the electrostatic chuck 112 is preliminarily created and the created approximate curve d is stored in the storage 512. In FIG. 4, the horizontal axis represents the maximum surface temperature of the electrostatic chuck 112, and the vertical axis represents the residual charge amount Q. Next, in the step (f), the residual charge amount Q corresponding to a minimum slope of the approximate curve d is set to 0.1.

Next, for the maximum surface temperature of the electrostatic chuck 112, with 130° C. corresponding to Q=1.0, which indicates that for example, a given residual charge amount Q is 10 times the residual charge amount Q (=0.1) determined in the step (f), 130° C. is determined as a lower limit for the maximum surface temperature of the electrostatic chuck 112. Moreover, for the maximum surface temperature of the electrostatic chuck 112, with 150° C. corresponding to Q=7.0, which indicates that for example, a given residual charge amount Q is 70 times the residual charge amount Q (=0.1) determined in the step (f), 150° C. is determined as an upper limit for the maximum surface temperature of the electrostatic chuck 112. In the step (h), the charge removal temperature is determined to be in the range of from 130° C. to 150° C., based on the determined maximum surface temperatures.

In such a manner, after the electrostatic chuck 112 is heated to a given temperature that makes it easier to remove the residual charge amount Q from the substrate W, the charge removal process is performed, thereby enabling the charge to be effectively removed from the substrate W.

In other words, in the substrate processing method according to the first embodiment, in step S10, the electrostatic chuck 112 is heated to a given charge removal temperature that makes it easier to remove the residual charge amount Q from the substrate W, and subsequently step S4 in which the charge is removed is performed. Accordingly, the charge can be efficiently removed from the substrate W.

Second Embodiment

Figure 9:
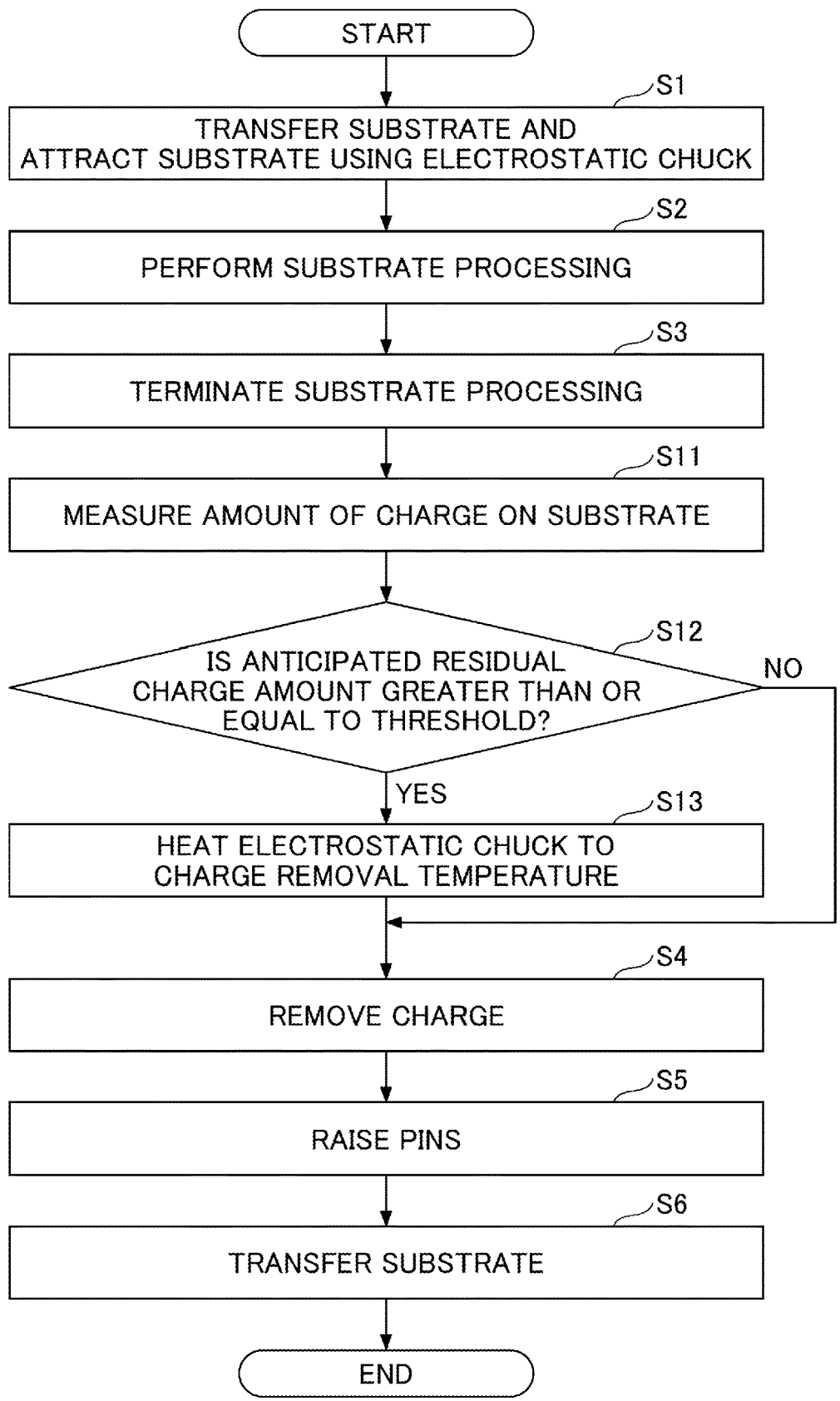
FIG. 9 is a flowchart illustrating an example of the substrate processing method according to a second embodiment.

Hereafter, the substrate processing method according to the second embodiment will be described with reference to FIG. 9. FIG. 9 is a flowchart illustrating an example of the substrate processing method according to the second embodiment. Note that the same step numbers are used to denote the same steps as those described in the substrate processing method according to the first embodiment.

When the substrate processing method according to the present embodiment is performed, the CPU 511 causes a given substrate N to be transferred to to the chamber 10 to thereby mount the transferred substrate W on the electrostatic chuck 112. Subsequently, the CPU 511 causes an appropriate DC voltage from the DC power source 17 to be applied to the chuck electrode 16, so that the substrate W is attracted to the electrostatic chuck 112 (step S1).

Then, the CPU 511 causes process gas to be introduced into the chamber 10, and causes a first RF signal to be applied to the bottom electrode 111. The CPU 511 also causes a plasma to be formed from the process gas, so that the substrate W is processed as suitably (step S2). Subsequently, the CPU 511 causes substrate processing to be performed based on a recipe. The substrate processing is then terminated (step S3). Next, according to the present embodiment, an amount of charge on the substrate W is measured (step S11).

Then, a measured residual charge amount Q for the substrate W is expressed as an anticipated residual charge amount, and it is determined whether the anticipated residual charge amount is larger than or equal to a threshold at which the operation of the supporting pins 41 stops (step S12). The threshold is preset and stored in the storage 512. For example, when the substrate is a wafer having a diameter of 300 mm, the threshold may be set to about 1 [μA·sec].

If the anticipated residual charge amount is larger than or equal to the threshold, the electrostatic chuck 112 is heated so that the surface temperature of the electrostatic chuck is equal to or exceeds a given charge removal temperature (step S13). The given charge removal temperature may be determined by referring to the storage 512 that preliminarily stores a given approximate curve showing the relationship between the maximum surface temperature of the electrostatic chuck 112 set during substrate processing and the residual charge amount Q for a given substrate. The surface temperature of the electrostatic chuck 112 is greater than or equal to the given charge removal temperature and may be smaller than or equal to a given upper limit of the maximum surface temperature of the electrostatic chuck 112.

In step S12, if the anticipated residual charge amount is less than the threshold, the charge removal process is performed, without performing the step S13 (step S4). Subsequently, the controller 1b causes the supporting pins 41 to be raised to thereby cause the substrate W to be removed from the electrostatic chuck 112 (step S5). Next, the controller 1b causes the substrate W to be transferred from the chamber 10 (step S6). Then, the process is terminated.

In the substrate processing method according to the present embodiment, if the anticipated residual charge amount determined based on the measured amount of charge on the substrate is larger than or equal to the threshold (hereinafter, also referred to as a first threshold), the surface temperature of the electrostatic chuck 112 is adjusted to be greater than or equal to the given charge removal temperature. Thus, while the supporting pins 41 are raised, decreased throughput due to halting of the operation of the supporting pins 41 can be avoided.

Note, however, that such a manner of adjusting the surface temperature of the electrostatic chuck 112 is not limiting. For example, a given amount of charge on the substrate is measured, and subsequently anticipated pin torque (i.e., anticipated torque to be applied to each supporting pin when the substrate is removed from the electrostatic chuck) is determined based on the measured amount of the charge. In this case, if the anticipated pin torque is greater than or equal to a second threshold at which the operation of the supporting pins 41 stops, the surface temperature of the electrostatic chuck 112 may be adjusted to be greater than or equal to a given charge removal temperature. The second threshold is preset and stored in the storage 512, as in the first threshold.

There is a given relationship between the pin torque and the residual charge amount. In an example of a method of determining the anticipated pin torque based on a measured residual charge amount Q, anticipated pin torque may be determined based on a given residual charge amount Q that is determined based on the linear relationship e illustrated in FIG. 5. Instead of the anticipated residual charge amount described above, when the anticipated pin torque is used, while the supporting pins 41 are raised, decreased throughput due to halting of the operation of the supporting pins 41 can be avoided.

Figure 10:
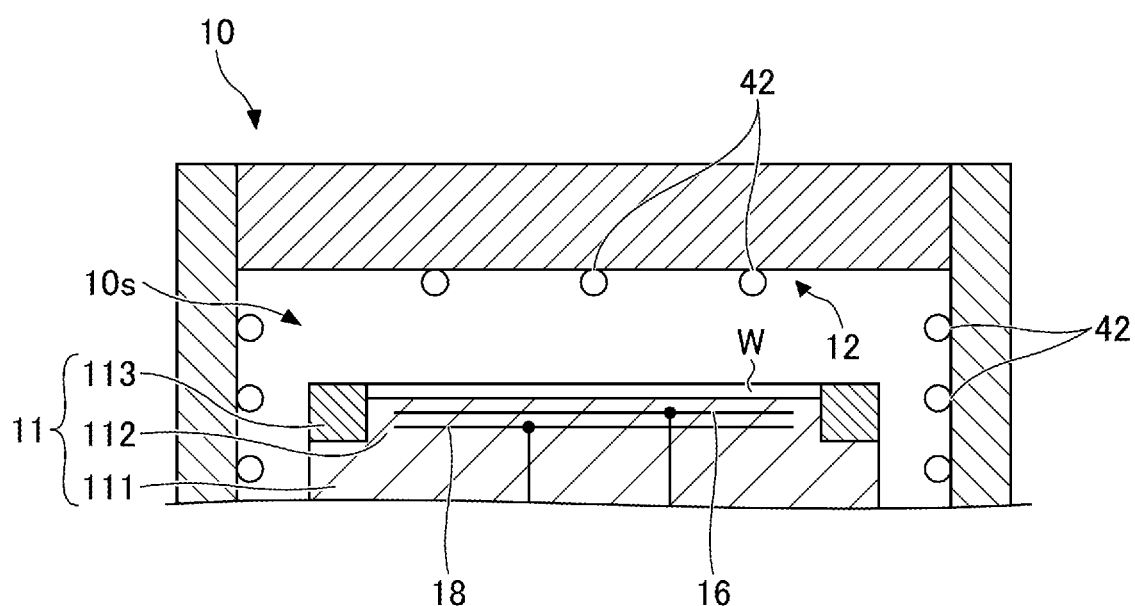
FIG. 10 is a cross-sectional view schematically illustrating an example of lamps in a substrate processing apparatus according to one embodiment.

In a method of heating the electrostatic chuck 112 to a given charge removal temperature, at least one among the heater 18 and lamps 42 may be used. The heater 18 is provided in the electrostatic chuck 112, and the lamps 42 are provided on the inner wall of the chamber 10 proximal to the electrostatic chuck 112. In the example of the substrate processing apparatus 1a illustrated in FIG. 1, the heater 18 heats the electrostatic chuck 112. Further, as illustrated in FIG. 10, the lamps 42 are disposed at the top and inner side surface of the chamber 10 proximal to the electrostatic chuck 112. In this case, at least one among the heater 18 of the electrostatic chuck 112 and the lamps 42 may heat the electrostatic chuck 112. Thus, charge transfer at the interface between the substrate W and the electrostatic chuck 112 is further facilitated, thereby enabling the charge to be efficiently removed from the substrate W. Note that each lamp 42 may be an infrared lamp.

As described above, the electrostatic chuck 112 has a temperature range in which a residual charge is more likely to be removed from a given substrate W. According to the substrate processing method according to the first embodiment and second embodiment, the temperature range is identified in advance by measuring one or more residual charge amounts, and the identified temperature range is stored in the storage 512. In such a manner, by referring to the storage 512, a given charge removal temperature is determined based on a given residual charge amount, and further, during the charge removal process, the temperature of the electrostatic chuck 112 is adjusted to the given charge removal temperature. By the substrate processing method described above, the temperature of the electrostatic chuck 112 is adjusted to an optimal value, thereby enabling the charge to be effectively removed from the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The substrate processing apparatus in the present disclosure is applicable to an automatic layer deposition (ALD) apparatus. Also, the substrate processing apparatus is applicable to any type selected from among a capacitively coupled plasma (CCP), an inductively coupled plasma (ICP), a radial line slot antenna (RLSA), an electron cyclotron resonance plasma (ECR), and a helicon wave plasma (HWP).

As long as the substrate processing apparatus is an apparatus in which a predetermined process (for example, deposition, an etch, or the like) is performed with respect to a substrate, the substrate processing apparatus is not limiting to an etching apparatus. The substrate processing apparatus may include a deposition apparatus, an aching apparatus, a doping apparatus.

According to one aspect of the present disclosure, a charge can be efficiently removed from a substrate.

What is claimed is:

1. A substrate processing method comprising:
   a) causing a substrate to be attracted to an electrostatic chuck;
   b) processing the substrate;
   c) determining a charge removal temperature based on information preliminarily stored in a storage, thereby adjusting a surface temperature of the electrostatic chuck to be greater than or equal to the determined charge removal temperature, the information indicating a relationship between a maximum surface temperature of the electrostatic chuck, during substrate processing, and a residual charge amount for the processed substrate; and
   d) removing a charge from the processed substrate.

2. The substrate processing method according to claim 1, wherein c) includes:
   measuring an amount of charge on the substrate,
   after d), determining whether an anticipated value indicating a residual charge to be stored on the substrate is greater than or equal to a threshold at which an upward operation of the substrate stops, and
   adjusting the surface temperature of the electrostatic chuck to be greater than or equal to the determined charge removal temperature, upon determining that the anticipated value is greater than or equal to the threshold.

3. The substrate processing method according to claim 1, wherein c) includes:
   measuring an amount of charge on the substrate,
   after d), determining whether an anticipated value indicating torque to be applied to a supporting pin is greater than or equal to a threshold at which the supporting pin stops lifting the substrate, the supporting pin being used in removing the substrate from the electrostatic chuck, and the anticipated value being determined based on the measured amount of the charge; and
   adjusting the surface temperature of the electrostatic chuck to be greater than or equal to the determined charge removal temperature, upon determining that the anticipated value is greater than or equal to the threshold.

4. The substrate processing method according to claim 1, wherein c) includes:
   e) creating an approximate curve indicating the relationship between the residual charge amount and the maximum surface temperature of the electrostatic chuck, thereby storing the approximate curve in the storage,
   f) determining a second residual charge amount for achieving a minimum slope of the approximate curve, based on the approximate curve,
   g) determining, based on the approximate curve, maximum surface temperatures of the electrostatic chuck at which respective corresponding residual charge amounts are greater than or equal to 5 and less than or equal to 70 times the second residual charge amount determined in f), and
   h) determining the charge removal temperature based on the determined maximum surface temperatures.

5. The substrate processing method according to claim 4, wherein g) includes determining maximum surface temperatures of the electrostatic chuck at which respective corresponding amounts of the residual charge are greater than or equal to 10 and less than or equal to 70 times the second residual charge amount determined in f).

6. The substrate processing method according to claim 4, wherein g) includes determining maximum surface temperatures of the electrostatic chuck at which respective corresponding residual charge amount are greater than or equal to 5 and less than or equal to 15 times the second residual charge amount determined in f).

7. The substrate processing method according to claim 4, wherein e) includes:
   raising the supporting pin at a timing at which the substrate is mounted on the electrostatic chuck, and
   integrating a current flowing into a chuck electrode of the electrostatic chuck, over time, thereby determining the residual charge amount, the current flowing in response to raising the supporting pin.

8. The substrate processing method according to claim 1, wherein c) includes:
   measuring an amount of charge on the processed substrate, and
   determining a DC current to be applied to the electrostatic chuck, based on the measured amount of the charge and the determined charge removal temperature.

9. The substrate processing method according to claim 1, wherein c) includes:
   adjusting, by at least one among a heater and a lamp, the surface temperature of the electrostatic chuck to be greater than or equal to the determined charge removal temperature, the heater being provided in the electrostatic chuck, and the lamp being provided on an inner wall of a chamber.

10. The substrate processing method according to claim 1, wherein d) is performed after c).

11. The substrate processing method according to claim 1, wherein c) is performed simultaneously with d).

12. A substrate processing apparatus comprising:
   a chamber;
   an electrostatic chuck configured to attract a substrate in the chamber; and
   a controller, the controller being configured to:

cause the substrate to be attracted to the electrostatic chuck;

cause the substrate to be processed;

determine a charge removal temperature based on information preliminarily stored in a storage, the information indicating a relationship between a maximum surface temperature of the electrostatic chuck, during substrate processing, and a residual charge amount for the substrate;

adjust a surface temperature of the electrostatic chuck to be greater than or equal to the determined charge removal temperature; and cause a charge to be removed from the substrate.

* * * * *